(12) United States Patent
Doyle et al.

(10) Patent No.: US 7,135,892 B2
(45) Date of Patent: Nov. 14, 2006

(54) PEAK DETECTOR SYSTEMS AND METHODS WITH LEAKAGE COMPENSATION

(75) Inventors: Bruce Doyle, Longmont, CO (US); Gregory L. Ranson, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 35 days.

(21) Appl. No.: 11/089,577

(22) Filed: Jun. 29, 2004

(65) Prior Publication Data

US 2005/0285634 A1    Dec. 29, 2005

(51) Int. Cl.
*G01R 19/00*    (2006.01)
(52) U.S. Cl. ...................................... 327/58
(58) Field of Classification Search ............ 327/52–54, 327/56, 58–60, 62, 72–73, 77–83, 87–90, 327/362
See application file for complete search history.

(56) References Cited

U.S. PATENT DOCUMENTS

| 4,634,895 | A |  | 1/1987 | Luong |  |
|---|---|---|---|---|---|
| 5,302,863 | A |  | 4/1994 | Walley et al. |  |
| 5,331,210 | A |  | 7/1994 | McCarroll |  |
| 5,388,010 | A | * | 2/1995 | Norton, Jr. | 360/46 |
| 5,491,434 | A | * | 2/1996 | Harnishfeger et al. | 327/50 |
| 5,969,545 | A |  | 10/1999 | Assadian et al. |  |
| 6,191,621 | B1 |  | 2/2001 | Ota |  |
| 6,211,716 | B1 | * | 4/2001 | Nguyen et al. | 327/307 |
| 6,653,870 | B1 | * | 11/2003 | Nakada | 327/58 |
| 6,671,075 | B1 | * | 12/2003 | Mizunaga | 398/202 |

FOREIGN PATENT DOCUMENTS

GB      2 220 273 A    6/1988

OTHER PUBLICATIONS

British Patent Office; Patent Search Report for Appl. GB0511888.0; dated Sep. 30, 2005.

* cited by examiner

*Primary Examiner*—My-Trang Nu Ton

(57) ABSTRACT

Systems, methodologies, media and other embodiments associated with peak detectors are described. One exemplary system embodiment includes a voltage peak detector comprising a first detector logic configured to detect a peak voltage of an input signal. The first detector logic has a circuit behavior that produces a leakage current that may alter the peak voltage. The system can also include a second detector logic configured to replicate the circuit behavior of the first detector logic including being configured to produce a replica leakage current that is equivalent to the leakage current. The second detector logic can be operably connected to the first detector logic to cause the replica leakage current to negate the leakage current.

25 Claims, 5 Drawing Sheets

PEAK DETECTOR SYSTEMS AND METHODS WITH LEAKAGE COMPENSATION

BACKGROUND

Peak detectors are electronic components that have been used in a variety of applications. A peak detector can be formed, for example, of an arrangement of diodes and operational amplifiers. A peak detector may be defined as a circuit that follows the voltage peaks of a given input signal and stores a maximum voltage value, for example, on a capacitor. During a selected time interval, if a maximum peak voltage comes along, the maximum voltage value is stored. It will be appreciated that the peak level is relative to a common mode level and hence could be the highest or lowest voltage. At the end of the time interval or at a desired event/condition, the input signal is disconnected from the storage capacitor and the capacitor is discharged to determine the stored peak voltage that was obtained during the time interval. The circuit can then be reset, the capacitor recharged to a predetermined level, and the sequence can be repeated to determine the next voltage peaks. However, complimentary metal oxide semiconductor (CMOS) devices may leak current even in an off state that may alter or distort the actual peak voltage value of a given input signal.

BRIEF DESCRIPTION OF THE DRAWINGS

The accompanying drawings, which are incorporated in and constitute a part of the specification, illustrate various example systems, methods, and so on that illustrate various example embodiments of aspects of the invention. It will be appreciated that the illustrated element boundaries (e.g., boxes, groups of boxes, or other shapes) in the figures represent one example of the boundaries. One of ordinary skill in the art will appreciate that one element may be designed as multiple elements or that multiple elements may be designed as one element. An element shown as an internal component of another element may be implemented as an external component and vice versa. Furthermore, elements may not be drawn to scale.

DETAILED DESCRIPTION

Figure 1:
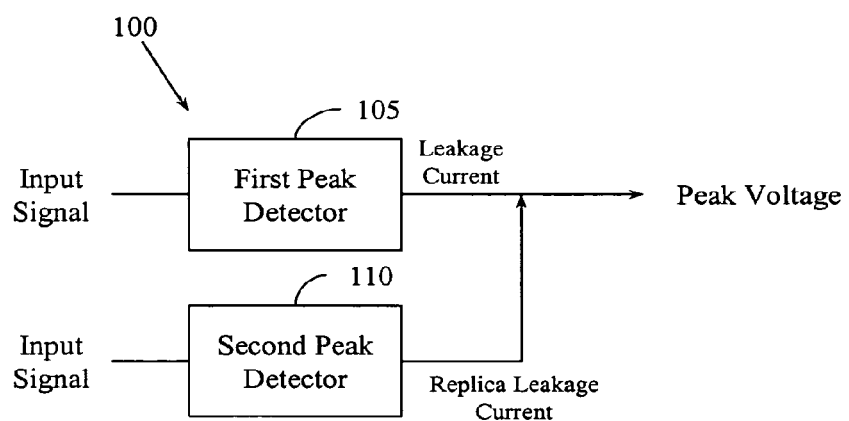
FIG. 1 illustrates an example voltage peak detector system.

Example systems, methods, circuits and other embodiments are described herein that are associated with compensating for current leakage in peak detectors. For example, a peak detector may be part of an integrated circuit and can be configured to detect a peak voltage value of an input signal such as an AC waveform. The peak detector may include a number of transistors like field effect transistors (FET) that have a high level of device leakage in an off state. Thus, in one example, when a peak voltage is detected, the peak detector is configured to turn off so that the detected peak voltage is not distorted by additional current. However, current leakage may still occur that may affect the peak voltage detected. In one example, a replica detector logic is provided that replicates the leakage current and applies the replica leakage current to negate or otherwise cancel the effects of the leakage current. More accurate detection of the peak voltage of the input signal can then be performed.

The following includes definitions of selected terms employed herein. The definitions include various examples and/or forms of components that fall within the scope of a term and that may be used for implementation. The examples are not intended to be limiting. Both singular and plural forms of terms may be within the definitions.

"Computer-readable medium", as used herein, refers to a medium that participates in directly or indirectly providing signals, instructions and/or data. A computer-readable medium may take forms, including, but not limited to, non-volatile media, volatile media, and transmission media. Non-volatile media may include, for example, optical or magnetic disks and so on. Volatile media may include, for example, optical or magnetic disks, dynamic memory and the like. Transmission media may include coaxial cables, copper wire, fiber optic cables, and the like. Transmission media can also take the form of electromagnetic radiation, like that generated during radio-wave and infra-red data communications, or take the form of one or more groups of signals. Common forms of a computer-readable medium include, but are not limited to, a floppy disk, a flexible disk, a hard disk, a magnetic tape, other magnetic medium, a CD-ROM, other optical medium, punch cards, paper tape, other physical medium with patterns of holes, a RAM, a ROM, an EPROM, a FLASH-EPROM, or other memory chip or card, a memory stick, a carrier wave/pulse, and other media from which a computer, a processor or other electronic device can read. Signals used to propagate instructions or other software over a network, like the Internet, can be considered a "computer-readable medium."

"Logic", as used herein, includes but is not limited to hardware, firmware, software and/or combinations of each to perform a function(s) or an action(s), and/or to cause a function or action from another logic, method, and/or system. For example, based on a desired application or needs, logic may include a software controlled microprocessor, discrete logic like an application specific integrated circuit (ASIC), an analog circuit, a digital circuit, a programmed logic device, a memory device containing instructions, or the like. Logic may include one or more gates, combinations of gates, or other circuit components. Logic may also be fully embodied as software. Where multiple logical logics are described, it may be possible to incorporate the multiple logical logics into one physical logic. Similarly, where a single logical logic is described, it may be possible to distribute that single logical logic between multiple physical logics.

An "operable connection", or a connection by which entities are "operably connected", is one in which signals, physical communications, and/or logical communications may be sent and/or received. Typically, an operable connection includes a physical interface, an electrical interface, and/or a data interface, but it is to be noted that an operable connection may include differing combinations of these or other types of connections sufficient to allow communication of signals. For example, two entities can be operably connected by being able to communicate signals to each other directly or through one or more intermediate entities like a processor, operating system, a logic, software, or other entity. Logical and/or physical communication channels can be used to create an operable connection.

"Signal", as used herein, includes but is not limited to one or more electrical or optical signals, analog or digital signals, data, one or more computer or processor instructions, messages, a bit or bit stream, or other means that can be received, transmitted and/or detected.

"Software", as used herein, includes but is not limited to, one or more computer or processor instructions that can be read, interpreted, compiled, and/or executed and that cause a computer, processor, or other electronic device to perform functions, actions and/or behave in a desired manner. The instructions may be embodied in various forms like routines, algorithms, modules, methods, threads, and/or programs including separate applications or code from dynamically linked libraries. Software may also be implemented in a variety of executable and/or loadable forms including, but not limited to, a stand-alone program, a function call (local and/or remote), a servelet, an applet, instructions stored in a memory, part of an operating system or other types of executable instructions. It will be appreciated by one of ordinary skill in the art that the form of software may be dependent on, for example, requirements of a desired application, the environment in which it runs, and/or the desires of a designer/programmer or the like. It will also be appreciated that computer-readable and/or executable instructions can be located in one logic and/or distributed between two or more communicating, co-operating, and/or parallel processing logics and thus can be loaded and/or executed in serial, parallel, massively parallel and other manners.

It has proven convenient at times, principally for reasons of common usage, to refer to signals as bits, values, elements, symbols, characters, terms, numbers, or the like. It should be borne in mind, however, that these and similar terms are to be associated with the appropriate physical quantities and are merely convenient labels applied to these quantities. Unless specifically stated otherwise, it is appreciated that throughout the description, terms like processing, detecting, applying, negating, compensating, determining, or the like, refer to actions and processes of a computer system, logic, processor, or similar electronic device that manipulates and/or transforms data and/or signals represented as physical (electronic) quantities.

Illustrated in FIG. 1, is an example of a voltage peak detector 100 that is configured to detect a peak voltage of an input signal and is configured to compensate for leakage current that may affect the accuracy of the detected peak voltage. The voltage detector 100 can include, for example, a first peak detector logic 105 that is configured to detect a peak voltage of an input signal. The first peak detector logic 105 can be implemented as a circuit. The circuit can be viewed as having a circuit behavior that responds in a certain way given a set of stimuli and/or circuit conditions/states. As part of the circuit behavior, the first peak detector logic 105 may produce a leakage current that may alter the peak voltage detected by the circuit.

Figure 2:
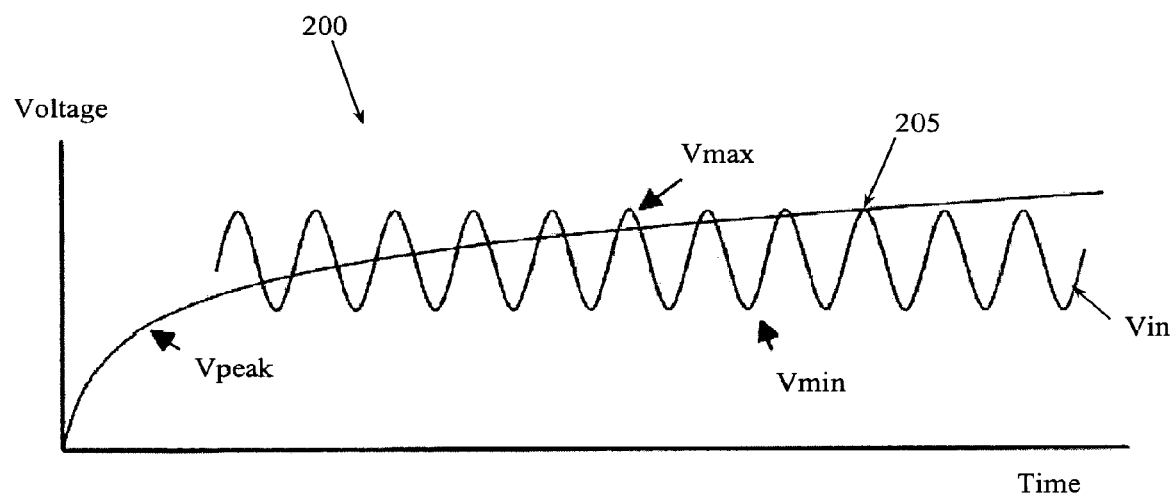
FIG. 2 illustrates an example graph of voltage over time associated with measuring a voltage peak of an AC signal.

With reference to FIG. 2, a graph 200 is shown that illustrates how the accuracy of a detected peak voltage $V_{peak}$ can be altered due to current leakage. The graph 200 illustrates an input signal $V_{in}$ that is, for example, an AC waveform having a voltage that changes between a maximum voltage peak $V_{max}$ and a minimum voltage peak $V_{min}$. Applying these components to the first peak detector logic 105 of FIG. 1, $V_{in}$ would represent the "Input Signal" supplied to the detector logic 105 and $V_{peak}$ would be the "Peak Voltage" detected. At seen in the graph 200, over a time period, the detected voltage peak $V_{peak}$ approaches the value for the maximum peak voltage $V_{max}$ until a peak voltage is detected at point 205. In one example, the first peak detector logic 105 is configured to turn off or otherwise disconnect the input signal so that additional current from the input signal no longer affects the detected peak voltage.

However, due to current leakage in electronic components such as field effect transistors (FET), the detected peak voltage $V_{peak}$ may continue to increase beyond the actual maximum peak voltage $V_{max}$. The current leakage can cause the detected peak voltage $V_{peak}$ to go beyond the actual maximum voltage $V_{max}$ of the input signal $V_{in}$ as seen on the right side of the graph 200. As a result, an inaccurate measurement of the peak voltage can occur. The detector system 100 is configured to compensate for the leakage current.

With reference again to FIG. 1, the voltage peak detector 100 can include a second peak detector logic 110 that is configured to replicate the circuit behavior of the first detector logic 105 based on an input signal. By replicating the behavior of the first peak detector logic 105, the second peak detector logic 110 is configured to respond in a similar or identical manner under equivalent stimulus conditions. As such, the second detector logic 110 is configured to produce a replica leakage current that is equivalent to the leakage current of the first peak detector logic 105. The second detector logic 110 is then operably connected to the first peak detector logic 105 to cause the replica leakage current to negate the leakage current of the first peak detector logic 105. In this manner, the leakage current can be eliminated or otherwise compensated for so that the peak voltage detected is not altered by the leakage current. A more reliable measurement of the peak voltage of the input signal can then be determined.

In one example, the second peak detector logic 110 is identical to the first peak detector logic 105. It will be appreciated, however, that equivalent logics or circuits can be used in order to create a replica leakage current that can negate the leakage current produced by the first peak detector logic 105. It will also be appreciated that the meaning of negate or compensate is not intended to imply an absolute cancellation of the leakage current at all times. Although an absolute cancellation can occur, a substantial cancellation or a reduction in the amount of leakage current is also contemplated.

Figure 3:
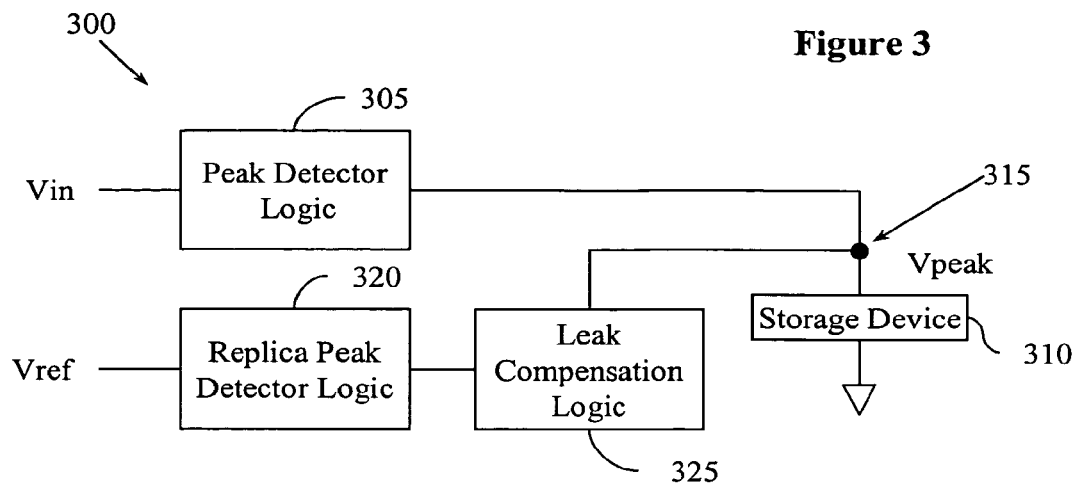
FIG. 3 illustrates another example voltage peak detector that compensates for current leakage.

Illustrated in FIG. 3 is another example of a voltage peak detector system 200 that is configured to compensate for current leakage similar to the voltage detector 100. For example, the voltage detector 300 can include a peak detector logic 305 configured to detect a peak voltage $V_{peak}$ of an input signal that has an input voltage $V_{in}$. The peak detector logic 305 can correspond to the first peak detector logic 105 from FIG. 1. As the input signal and it's voltage $V_{in}$ are processed by the peak detector logic 305, the voltage can be stored in a storage device 310 such as a capacitor. The peak voltage $V_{peak}$ that is stored in the storage capacitor 310 can be obtained from a node 315.

As previously described, the detected peak voltage $V_{peak}$ may be altered by current leakage from the peak detector logic 305, resulting in an inaccurate detection of the maximum voltage of the input signal $V_{in}$. To compensate for the current leakage, a replica peak detector logic 320 is provided in the voltage detector 300 that is configured to detect a replica peak voltage based on a reference input signal having a voltage $V_{ref}$ where the peak voltage $V_{peak}$ and the replica peak voltage are substantially equal. The replica peak detector logic 320 can correspond to the second peak detector logic 110 of FIG. 1.

In one example, the peak detector logic 305 and the replica peak detector logic 320 are identical circuits that facilitate detection of the peak voltage of their input signals, $V_{in}$ and $V_{ref}$, respectively. It will be appreciated that the identical nature of circuitry, which can be used for the peak detector logic 305 and the replica peak detector logic 310, refers to the circuitry for voltage detection. It will be appreciated that additional circuitry and/or components may be included in logic 305 and/or logic 320 that may make the logics 305, 320 not identical as a whole, but rather substantially identical. For example, a reset switch may be included in the peak detector logic 305 that may or may not be included in the replica peak detector logic 320.

With further reference to FIG. 3, in the event that a leakage current is produced by the peak detector logic 305, the leakage current will be injected onto the node 315 that will affect the peak voltage $V_{peak}$ stored by the storage device 310. Since the replica peak detector logic 320 is configured to duplicate the behavior of the peak detector logic 305, a replica leakage current will be produced. A leak compensation logic 325 is configured to operably connect the replica peak detector logic 320 with the peak detector logic 305 so that the replica leakage current is applied from the replica peak detector logic to the peak detector logic. This causes the leakage current from the peak detector logic 305 to be negated so that the detected peak voltage $V_{peak}$ can be maintained at a more accurate peak value.

In one example, the leak compensation logic 325 can be configured to apply the replica leakage current to the node 315 so that it pulls a current from the node 315 that is equivalent to the injected leakage current from peak detector logic 305. Thus, the leakage current from peak detector logic 305 can be negated or cancelled so as to not affect the detected peak voltage $V_{peak}$. In this manner, the voltage detector system 300 can more accurately detect the peak voltage of the input signal $V_{in}$. In one example, the input signal to the replica peak detector logic 320 is a reference input signal having a reference voltage $V_{ref}$. The reference input signal can be, for example, supplied from a voltage generator where the reference signal has a peak voltage equal to a desired peak voltage that is to be detected at node 315.

Figure 4:
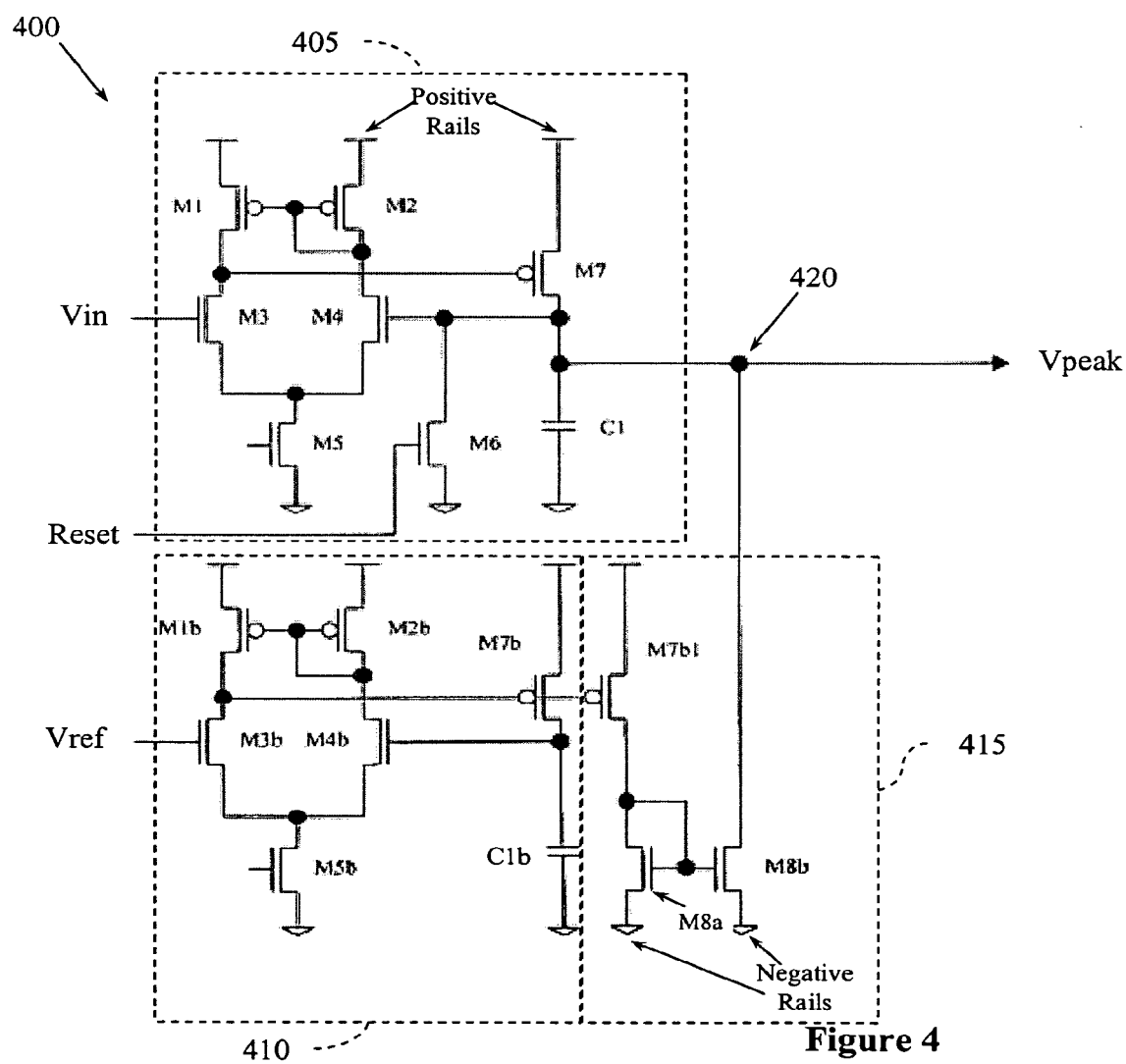
FIG. 4 is one example of a voltage peak detector circuit that compensates for current leakage.

Illustrated in FIG. 4 is an example voltage peak detector circuit 400 that is configured to negate or otherwise compensate for leakage current that may affect the accurate detection of a voltage peak. The voltage peak detector 400 can be generally described as having three functional components, namely, a peak detector 405, a replica peak detector 410, and a leak compensation circuit 415. These three components can represent one example implementation of the peak detector logic 305, the replica peak detector logic 320, and the leak compensation logic 325, respectively, from FIG. 3. It will be appreciated that the voltage detector circuit 400 can be implemented in other ways and have other configurations and components that are connected in other desired ways to produce an equivalent functionality as described herein.

The peak detector 405 is configured to detect a peak voltage $V_{peak}$ of an input signal like an AC waveform having a voltage value $V_{in}$. As the input signal $V_{in}$ is processed through the peak detector 405, the peak voltage $V_{peak}$ is stored in a capacitor C1. At a point when the capacitor C1 is charged to a level that becomes greater than the peak voltage level of the input signal $V_{in}$, device M7 is caused to turn off so that no further current reaches the capacitor C1. At this point, the capacitor C1 contains the peak voltage $V_{peak}$ of the input signal $V_{in}$. However as previously explained, leakage current may reach capacitor C1 due to leakage of the device M7 even when in an "off" state. The leakage current may then affect the accuracy of the voltage peak $V_{peak}$ that is detected by the capacitor C1.

To compensate for the leakage current, the replica peak detector 410 and the leak compensation circuit 415 are operably connected to the peak detector 405 to negate the leakage current between the device M7 and the capacitor C1. For example, the replica peak detector 410 is configured to replicate the peak detector 405 and to produce a replica leakage current that is equal to the leakage current that may pass through the device M7. The leak compensation circuit 415 is configured to negate the leakage current of the peak detector 405 with the replica leakage current. For example, the replica leakage current coming from replica peak detector 410 can be applied to a node 420 that is between the device M7 and the capacitor C1.

Looking more closely to the voltage detector circuit 400, a reset pulse can be used to initially set the level of input signal $V_{in}$ to ground using transistor M6. If the voltage level of the input signal $V_{in}$ is above the voltage value of $V_{peak}$ at node 420, the voltage on node 420 is feeding back into transistor M4 and input voltage $V_{in}$ is going into transistor M3. Once the voltage level of $V_{in}$ has risen to about the voltage level of $V_{peak}$, current will flow in the left side of the differential input pair (M3, M4). This will cause the gate of device M7 to be pulled down which causes M7 to be forward-biased and hence, the voltage $V_{peak}$ will begin to rise. As the voltage level $V_{peak}$ is pulled close to the maximum voltage level of $V_{in}$, the differential pair M3, M4 no longer switch. The inputs, when $V_{in}$ is at its maximum, are equal and the peak detector circuit 405 is in quiescent condition. At this point, the voltage level of $V_{peak}$ is deemed to be the peak value of the input signal AC waveform. The device M7 changes to an "off" state so that no further charging of the capacitor C1 occurs. However, device M7 may continue to leak current onto the capacitor C1 even in an "off" state and the current leak can change the accuracy of the peak voltage $V_{peak}$ that is detected on capacitor C1. This difference can be seen, for example, in the graph of FIG. 2 where the $V_{peak}$ line becomes greater than the maximum voltage $V_{max}$ of the input signal $V_{in}$.

The replica peak detector 410 is configured with identical devices that are similarly labeled except the labels have a suffix "b." For example, the device M7 in peak detector 405 has a replica device that is labeled M7b. Since the replica peak detector replicates the behavior of the peak detector 405, and is actually a duplicate circuit in this example, the leakage current through device M7b should be identical to the leakage current through device M7. The leak compensation circuit 415 then uses the leakage current coming from device M7b to pull out an equivalent current from the node 420, and thus from $V_{peak}$, to correct the peak voltage overshoot that is illustrated in FIG. 2. In the logic 410, the replica leakage current comes from device M7b and generates an equivalent current in device M7b1 that is then ORed into the node 420 via the device M8b. In effect, electrons will flow from the negative rail on the side of the device M8b to the positive rail on the side connected to the device M7. Thus, electrons that are removed from the node 420, caused by the leakage current of device M7 going to the positive rail, will be replenished by electrons flowing through the device M8b going into the node 420.

Thus, in one example, the leak compensation circuit 415 is a current mirror so that whatever current is flowing through the device M7b has to go through the device M7b1 because of the singular path. The gate-source voltage across the device M7b is the same as the gate-source voltage across device M7b1. This causes the current in device M8b to be the same as the current in the device M8a. So the current created in M7b1 is identical to the current leakage from device M7. But since the leak compensation circuit 415 is referenced to ground (e.g. negative rails), the circuit 415 is configured to force electrons into the node 420 to replenish the electrons lost from the node 420 flowing to the positive rail of the device M7.

The reference voltage $V_{ref}$ that is the input signal to the replica peak detector 410 can be set as a desired peak voltage that is to be detected at the $V_{peak}$ node 420. $V_{ref}$ can be created on-chip by a voltage reference so that $V_{ref}$ gives you the correct leakage current to replicate the peak detector 405.

In operation, once the desired peak voltage $V_{peak}$ is reached on the capacitor C1 and node 420, and respectively at replica capacitor C1b, the device M7 and the replica device M7b turn off. Both devices, M7 and M7b, will create leakage currents that are equivalent. The leakage current from the replica device M7b, which is referred to as the replica leakage current, is then used to negate or compensate the leakage current from the device M7. In one example, this can provide for automatic calibration of a device that is calibrated based on the value of $V_{peak}$.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks. While the figures illustrate various actions occurring in serial, it is to be appreciated that various actions could occur concurrently, substantially in parallel, and/or at substantially different points in time.

Figure 5:
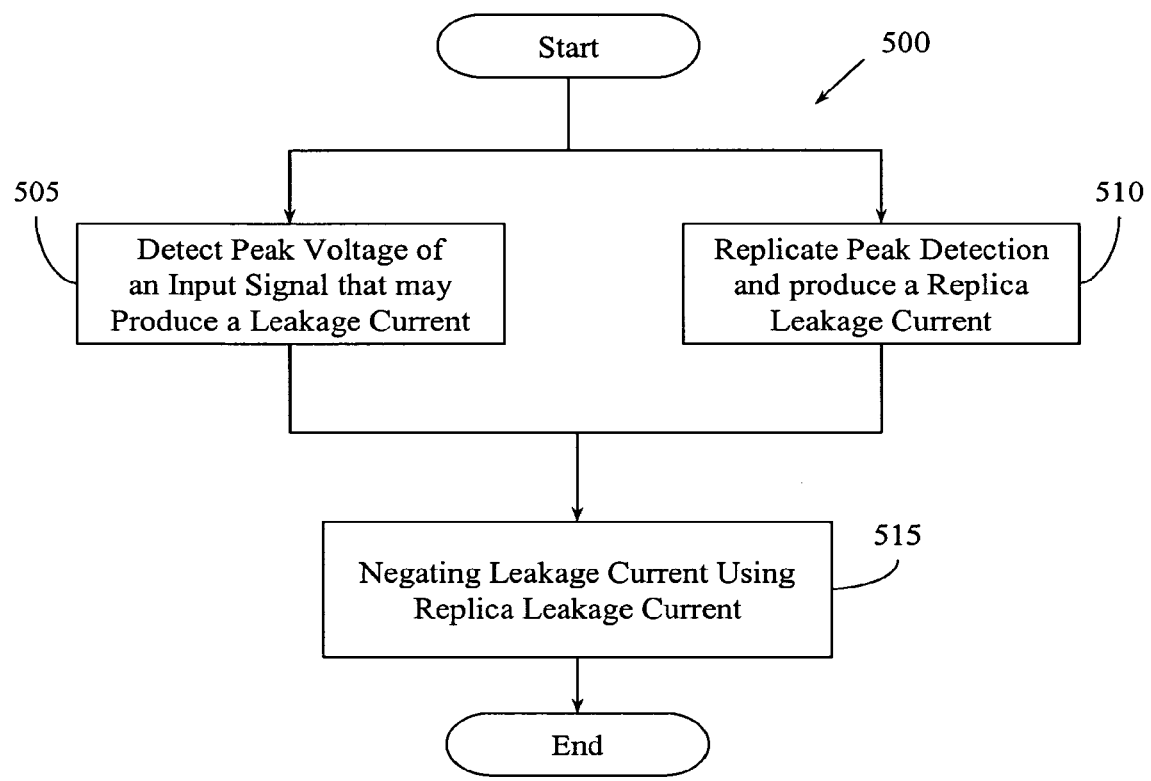
FIG. 5 illustrates an example methodology associated with compensating for current leakage in a voltage detector.

Illustrated in FIG. 5 is an example methodology 500 that can be associated with a voltage peak detector. The illustrated elements denote "processing blocks" that may be implemented in logic. In one example, the processing blocks may represent executable instructions that cause a computer, processor, and/or logic device to respond, to perform an action(s), to change states, and/or to make decisions. Thus, the described methodologies can be implemented as processor executable instructions and/or operations provided by a computer-readable medium. In another example, the processing blocks may represent functions and/or actions performed by functionally equivalent circuits such as an analog circuit, a digital signal processor circuit, an application specific integrated circuit (ASIC), or other logic device. The diagram of FIG. 5, as well as the other illustrated diagrams, are not intended to limit the implementation of the described examples. Rather, the diagrams illustrate functional information one skilled in the art could use to fabricate circuits, generate software, or use a combination of hardware and software to perform the illustrated processing.

With reference to FIG. 5, for example, a peak voltage can be detected for an input signal (block 500). The peak voltage, also referred to as first peak voltage, can be detected by using a device that has a circuit behavior which produces a leakage current that may alter the peak voltage. At block 510, a second peak voltage is detected in a manner that replicates the peak detection process of block 505. During the detection of the second peak voltage, a replica leakage current is produced that is equivalent to the leakage current. The replica leakage current can then be applied to negate or otherwise compensate for the leakage current (block 515). In this manner, the leakage current can be cancelled so as to not affect the detection of the peak voltage and a more accurate peak voltage can be determined.

In one example, the detecting process at block 505 can include detecting using a first circuit that has a circuit behavior that produces the leakage current after the peak voltage is detected. The replica or duplicate detecting process at block 510 can include detecting the second peak voltage with a second circuit that replicates the circuit behavior of the first circuit including producing the replica leakage current. The detecting at block 510 can also include processing a second input signal from which the second peak voltage is detected. The second input signal can have a desired peak voltage value that is equal to the peak voltage to be detected. In another example, the peak voltage can be stored in a capacitor. Using the methodology 500, a more accurate peak voltage can be detected. The peak voltage can then be used, for example, to calibrate a selected device such as calibrating a clocking function based on the peak voltage detected. One example of this use is described with reference to FIG. 6.

Figure 6:
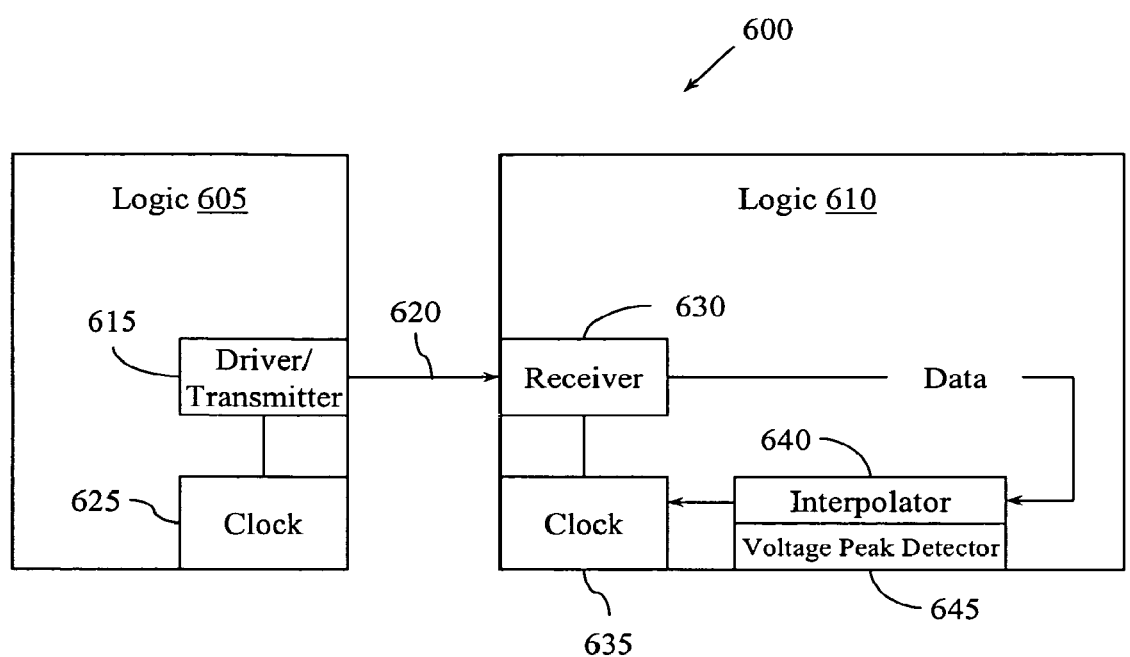
FIG. 6 illustrates an example diagram of a point-to-point link configured with an example peak detector as described herein.

Illustrated in FIG. 6 is an example point-to-point (P2P) system 600 that can be configured with the example systems and methods described herein. The system 600 is an example point-to-point communication link that connects two logics such as logic 605 and logic 610. The logics 605, 610 may be electronic components within a computing device, an image forming device, or other type of electronic device, may be components within a processor, chips, or other types of components that can communicate signals between each other. For example, the logic 605 includes a driver/transmitter 615 that is configured to communicate signals over a point-to-point link 620 and is driven by a clock 625. The logic 610 includes a receiver 630 configured to receive signals from the driver 615 and is controlled by a clock 635. To synchronize the data (e.g. bits) that are received by the receiver 630, an interpolator 640 can be provided that is configured to line up the data received in accordance with the data transmitted by the driver 615. A voltage peak detector 645 can be operably connected to the interpolator 640 and/or the clock 635 to automatically calibrate the receiving clock 635 so that the clock 635 samples the data over the point-to-point link 620 so that received data coincides with how the data was transmitted in accordance with the transmitting clock 625. Thus, by detecting the peak voltage of the signal and knowing what the peak voltage was designed to be, the clock 635 can be dynamically adjusted so that variations caused by heat and/or voltage changes can be addressed without a manual calibration.

Figure 7:
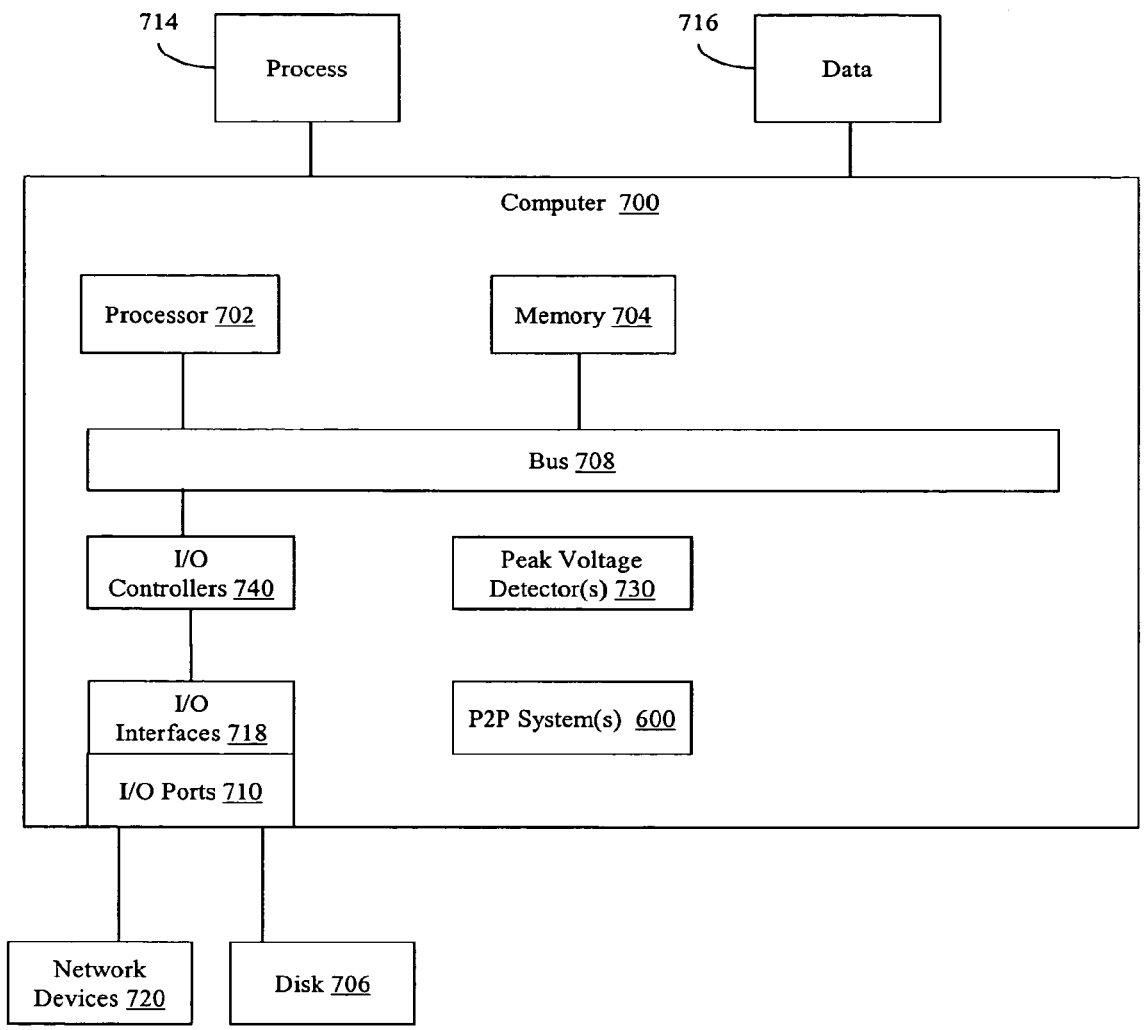
FIG. 7 illustrates an example computing device in which example systems and methods illustrated herein can operate.

Illustrated in FIG. 7 is an example computing device like computer 700 that includes a processor 702, a memory 704, and input/output ports 710 operably connected by a bus 708. In one example, the computer 700 may include one or more voltage peak detectors 730 configured to detect a peak voltage of an input signal and compensate for leakage current that may affect the accuracy of the peak voltage. The voltage peak detector 730 can be configured using any of the previously described systems and methods, and their equivalents. The computer 700 may also include one or more components that are connected by point-to-point (P2P) links similar to the P2P system 600 illustrated in FIG. 6. It will be appreciated that the voltage detector(s) 730 and P2P system(s) 600 can be implemented in the processor 702, and/or in other components of the computer 700 but are only illustrated in FIG. 7 as logical blocks within the computer 700.

Generally describing an example configuration of the computer 700, the processor 702 can be a variety of various processors including dual microprocessor and other multi-processor architectures. The memory 704 can include volatile memory and/or non-volatile memory. The non-volatile memory can include, but is not limited to, ROM, PROM, EPROM, EEPROM, and the like. Volatile memory can include, for example, RAM, synchronous RAM (SRAM), dynamic RAM (DRAM), synchronous DRAM (SDRAM), double data rate SDRAM (DDR SDRAM), and direct RAM bus RAM (DRRAM).

A disk 706 may be operably connected to the computer 700 via, for example, an input/output interface (e.g., card, device) 718 and an input/output port 710. The disk 706 can include, but is not limited to, devices like a magnetic disk drive, a solid state disk drive, a floppy disk drive, a tape drive, a Zip drive, a flash memory card, and/or a memory stick. Furthermore, the disk 706 can include optical drives like a CD-ROM, a CD recordable drive (CD-R drive), a CD rewriteable drive (CD-RW drive), and/or a digital video ROM drive (DVD ROM). The memory 704 can store processes 714 and/or data 716, for example. The disk 706 and/or memory 704 can store an operating system that controls and allocates resources of the computer 700.

The bus 708 can be a single internal bus interconnect architecture and/or other bus or mesh architectures. While a single bus is illustrated, it is to be appreciated that computer 700 may communicate with various devices, logics, and peripherals using other busses that are not illustrated (e.g., PCIE, SATA, Infiniband, 1394, USB, Ethernet). The bus 708 can be of a variety of types including, but not limited to, a memory bus or memory controller, a peripheral bus or external bus, a crossbar switch, and/or a local bus. The local bus can be of varieties including, but not limited to, an industrial standard architecture (ISA) bus, a microchannel architecture (MSA) bus, an extended ISA (EISA) bus, a peripheral component interconnect (PCI) bus, a universal serial (USB) bus, and a small computer systems interface (SCSI) bus.

The computer 700 may interact with input/output devices via i/o interfaces 718 and the input/output ports 710. Input/output devices can include, but are not limited to, a keyboard, a microphone, a pointing and selection device, a modem 720, cameras, video cards, displays, disk 706, network devices, and the like. The input/output ports 710 can include but are not limited to, serial ports, parallel ports, and USB ports.

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Additional advantages and modifications will readily appear to those skilled in the art. Therefore, the invention is not limited to the specific details, the representative apparatus, and illustrative examples shown and described. Thus, this application is intended to embrace alterations, modifications, and variations that fall within the scope of the appended claims. Furthermore, the preceding description is not meant to limit the scope of the invention. Rather, the scope of the invention is to be determined by the appended claims and their equivalents.

To the extent that the term "includes" or "including" is employed in the detailed description or the claims, it is intended to be inclusive in a manner similar to the term "comprising" as that term is interpreted when employed as a transitional word in a claim. Furthermore, to the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

What is claimed is:

1. A voltage peak detector, comprising:
   a first detector logic configured to detect a peak voltage of an input signal, the first detector logic having a circuit behavior that produces a leakage current that may alter the peak voltage;
   a second detector logic configured to replicate the circuit behavior of the first detector logic including logic for detecting a replica peak voltage and being configured to produce a replica leakage current that is equivalent to the leakage current; and
   the second detector logic being operably connected to the first detector logic to cause the replica leakage current to negate the leakage current.

2. The voltage peak detector of claim 1 where the second detector logic is identical to the flint detector logic.

3. The voltage peak detector of claim 1 further including a leak compensation circuit configured to operably connect the second detector logic to the first detector logic.

4. The voltage peak detector of claim 3 where the leak compensation circuit is a current minor.

5. The voltage peak detector of claim 1 where the first detector logic includes:
   a capacitor configured to store the peak voltage of the input signal; and
   a gate connected to the capacitor and being configured to control flow of the input signal to the capacitor where in an off state, the gate allows the leakage current to flow;
   where the second detector logic includes:
   a replica capacitor configured to store a replica peak voltage of a reference signal;
   a replica gate connected to the replica capacitor and being configured to control flow of the reference signal to the replica capacitor, where in an off state, the replica gate allows the replica leakage current to flow that is identical to the leakage current; and
   the replica leakage current being applied between the gate and the capacitor of the first detector logic to cancel effects of the leakage current.

6. The voltage peak detector of claim 5 where the gate and the replica gate are formed of one or more transistors.

7. The voltage peak detector of claim 1 where the first detector logic and the second detector logic are integrated circuits.

8. A system comprising:
   a peak detector logic configured to detect a peak voltage of an input signal;

a replica peak detector logic configured to detect a replica peak voltage of a reference signal where the peak voltage and the replica peak voltage are substantially equal; and a leak compensation logic configured to apply a replica leakage current from the replica peak detector logic to the peak detector logic that negates a leakage current from the peak detector logic to maintain the detected peak voltage at a desired peak value.

9. The system of claim 8 where the peak detector logic includes a storage device to store the peak voltage.

10. The system of claim 9 where the peak detector logic includes a gate connected to the storage device, the gate being configured to turn off when a desired peak voltage is stored in the storage device.

11. The system of claim 10 where the leak compensation logic is configured to apply the replica leakage current to a node between the gate and the storage device to negate the leakage current from the gate.

12. The system of claim 8 where the leak compensation logic is a current mirror circuit.

13. The system of claim 8 where the peak detector logic and the replica peak detector logic are equivalent circuits that are configured to produce an equivalent output voltage.

14. The system of claim 8 where:
the peak detector logic includes a means for detecting the peak voltage of the input signal;
the replica peak detector logic includes a means for detecting the replica peak voltage of the reference signal; and
the leak compensation logic includes a means for negating the leakage current.

15. The system of claim 8 where the system is embodied in an electronic device and operably connected to dynamically calibrate a clocking function.

16. The system of claim 15 where the electronic device includes a processor and where the system is operably connected to a clock that controls a receiving component of a point-to-point link.

17. The system of claim 8 where the system is processor chip.

18. A method of detecting a peak voltage, comprising:
detecting a first peak voltage of an input signal and producing a leakage current that may alter the peak voltage;
detecting a second peak voltage that replicates the detecting of the first peak voltage and producing a replica leakage current that is equivalent to the leakage current; and
negating the leakage current using the replica leakage current.

19. The method of claim 18 where the detecting the second peak voltage includes processing a second input signal having a desired peak voltage value.

20. The method of claim 18 where the method is implemented by a circuit and where:
the detecting the first peak voltage includes detecting with a first circuit having a circuit behavior that produces the leakage current after the peak voltage is detected; and
the detecting the second peak voltage includes detecting with a second circuit that replicates the circuit behavior of the first circuit including producing the replica leakage current that is used to negate the leakage current.

21. The method of claim 18 where the negating step is performed when the peak voltage is detected.

22. The method of claim 18 where the detecting includes storing the peak voltage in a capacitor.

23. The method of claim 18 further including calibrating a clocking function based on the peak voltage detected.

24. A computing system, comprising:
a processor configured to process executable instructions;
one or more memories configured to store at least the executable instructions;
one or more electronic components connected to each other with point-to-point links that communicate signals, the one or more electronic components including at least one receiver component configured to receive signals from a point-to-point link and being controlled by a clock;
a means for detecting a peak voltage of a voltage signal where the means for detecting the peak voltage may produce a leakage current that can affect the peak voltage, the means for detecting being configured for calibrating the clock using the peak voltage;
means for detecting a replica peak voltage that replicates the peak voltage;
a means for producing a replica leakage current from the means for detecting a replica peak voltage, the replica leakage current being equal to the leakage current; and
a means for negating the leakage current of the means for detecting the peak voltage with the replica leakage current so that the peak voltage is not affected by the leakage current.

25. A voltage detector system comprising:
a means for detecting a peak voltage of an input signal where a leakage current may be present; and
a means for replicating the means for detecting the peak voltage and for negating the leakage current using a replica leakage current that is equivalent to the leakage current.

* * * * *

UNITED STATES PATENT AND TRADEMARK OFFICE
CERTIFICATE OF CORRECTION

| | | |
|---|---|---|
| PATENT NO. | : 7,135,892 B2 | Page 1 of 1 |
| APPLICATION NO. | : 11/089577 | |
| DATED | : November 14, 2006 | |
| INVENTOR(S) | : Bruce Doyle et al. | |

It is certified that error appears in the above-identified patent and that said Letters Patent is hereby corrected as shown below:

In column 10, line 34, in Claim 2, delete "flint" and insert -- first --, therefor.

In column 10, line 39, in Claim 4, delete "minor" and insert -- mirror --, therefor.

Signed and Sealed this

Sixteenth Day of December, 2008

JON W. DUDAS
*Director of the United States Patent and Trademark Office*